United States Patent
Kajiwara et al.

(10) Patent No.: US 8,643,185 B2
(45) Date of Patent: Feb. 4, 2014

(54) SEMICONDUCTOR APPARATUS, MANUFACTURING METHOD OF SEMICONDUCTOR APPARATUS, AND JOINT MATERIAL

(75) Inventors: Ryoichi Kajiwara, Hitachi (JP); Kazutoshi Itou, Hitachi (JP); Hiroi Oka, Tamamura (JP); Takuya Nakajo, Numata (JP); Yuichi Yato, Takasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 799 days.

(21) Appl. No.: 12/246,811

(22) Filed: Oct. 7, 2008

(65) Prior Publication Data

US 2009/0096100 A1 Apr. 16, 2009

(30) Foreign Application Priority Data

Oct. 10, 2007 (JP) .................... 2007-264412

(51) Int. Cl.
- *H01L 23/488* (2006.01)
- *H01L 21/60* (2006.01)
- *H01B 1/22* (2006.01)

(52) U.S. Cl.
USPC ................ 257/772; 257/779; 257/741

(58) Field of Classification Search
USPC .......... 257/762, 772, E21.509, E23.023, 779, 257/E23.026, E21.508
See application file for complete search history.

(56) References Cited

U.S. PATENT DOCUMENTS

| | | | | |
|---|---|---|---|---|
| 4,480,261 A | * | 10/1984 | Hattori et al. | 257/753 |
| 4,711,814 A | * | 12/1987 | Teichmann | 428/403 |
| 4,857,233 A | * | 8/1989 | Teichmann et al. | 252/513 |
| 5,561,321 A | * | 10/1996 | Hirano et al. | 257/700 |
| 5,569,960 A | * | 10/1996 | Kumazawa et al. | 257/738 |
| 5,840,432 A | * | 11/1998 | Hirai et al. | 428/570 |
| 6,042,933 A | * | 3/2000 | Hirai et al. | 428/209 |
| 6,307,272 B1 | * | 10/2001 | Takahashi et al. | 257/787 |
| 6,479,763 B1 | * | 11/2002 | Igaki et al. | 174/262 |
| 6,563,225 B2 | * | 5/2003 | Soga et al. | 257/782 |
| 6,580,601 B2 | * | 6/2003 | Hamada et al. | 361/523 |
| 6,855,579 B2 | * | 2/2005 | Takeda et al. | 438/127 |
| 7,012,320 B2 | * | 3/2006 | Takeda et al. | 257/666 |
| 2003/0020159 A1 | * | 1/2003 | Schwarzbauer | 257/705 |
| 2003/0193094 A1 | * | 10/2003 | Takahashi et al. | 257/780 |
| 2004/0150082 A1 | * | 8/2004 | Kajiwara et al. | 257/678 |
| 2006/0163744 A1 | * | 7/2006 | Vanheusden et al. | 257/773 |
| 2008/0145607 A1 | | 6/2008 | Kajiwara et al. | |
| 2008/0315401 A1 | * | 12/2008 | Imamura et al. | 257/712 |

FOREIGN PATENT DOCUMENTS

| | | | | |
|---|---|---|---|---|
| JP | 07335022 A | * | 12/1995 | ............ H01B 1/22 |
| JP | 8-316254 A | | 11/1996 | |
| JP | 2001307549 A | * | 11/2001 | ............ H01B 1/22 |
| JP | 2005-340267 | | 12/2005 | |
| JP | 2006-59905 | | 3/2006 | |
| JP | 2006-159201 | | 6/2006 | |
| JP | 2007-180059 | | 7/2007 | |
| JP | 2007-214340 A | | 8/2007 | |
| JP | 2008-153470 | | 7/2008 | |

* cited by examiner

*Primary Examiner* — Long K Tran
*Assistant Examiner* — Jordan Klein
(74) *Attorney, Agent, or Firm* — Mattingly & Malur, PC

(57) ABSTRACT

A die bonding portion is metallically bonded by well-conductive Cu metal powders with a maximum particle diameter of about 15 μm to 200 μm and adhesive layers of Ag, and minute holes are evenly dispersed in a joint layer. With this structure, the reflow resistance of about 260° C. and reliability under thermal cycle test can be ensured without using lead.

11 Claims, 7 Drawing Sheets

FIG. 7

○: GOOD  ×: DEFECTIVE  △: NOT GOOD  —: NOT EVALUATED BECAUSE OF THE PRESENCE OF DEFECT

| No | METAL POWDER | | BONDING MATERIAL (WEIGHT RATIO OF SILVER) | | | EVALUATION | | | NOTES |
|---|---|---|---|---|---|---|---|---|---|
| | MATERIAL | PARTICLE DIAMETER (μm) | ORGANIC SILVER | SILVER OXIDE | NANO-SILVER | BONDING STRENGTH | HEAT DISSIPATION | RELIABILITY | |
| 1 | Cu/Ag | ≦10 | 30 | 20 | 50 | △ | × | — | LARGE VOIDS |
| 2 | Cu/Ag | 5~15 | 30 | 20 | 50 | ○ | ○ | ○ | |
| 3 | Cu/Ag | 1~75 | 100 | 0 | 0 | △ | ○ | ○ | |
| 4 | Cu/Ag | 5~75 | 30 | 20 | 50 | ○ | ○ | ○ | |
| 4' | Cu/Ag | 5~75 | 50 | 20 | 30 | △ | △ | △ | |
| 5 | Cu/Ag | 10~75 | 0 | 40 | 30 | ○ | ○ | ○ | |
| 6 | Cu/Ag | 1~200 | 20 | 80 | 0 | ○ | × | — | LARGE POROSITY |
| 7 | Cu/Ag | 1~300 | 30 | 20 | 50 | ○ | ○ | ○ | |
| 8 | Al/Ni/Au | 5~75 | 30 | 50 | 20 | ○ | ○ | ○ | |
| 9 | Ni/Au | 5~75 | 30 | 0 | 70 | ○ | ○ | ○ | |
| 10 | Ag | 5~75 | 30 | 20 | 50 | × | × | — | |
| 11 | Cu | 5~75 | 30 | 0 | 70 | ○ | ○ | ○ | EXCESSIVE OXIDATION |
| 12 | Cu | 5~75 | 30 | 0 | 70 | ○ | ○ | ○ | |
| 13 | Ag+Ni/Au | 5~75 | 30 | 50 | 20 | ○ | ○ | ○ | |
| 14 | Ag+u/Ag | 5~75 | 30 | 50 | 20 | ○ | ○ | ○ | |

SINTERING CONDITIONS: SINTERED UNDER PRESSURELESS CONDITION IN ATMOSPHERE AT 250°C EXCEPT NO. 12
ATMOSPHERE IS CHANGED TO REDUCTIVE ATMOSPHERE IN SINTERING PROCESS IN NO. 12

SEMICONDUCTOR APPARATUS, MANUFACTURING METHOD OF SEMICONDUCTOR APPARATUS, AND JOINT MATERIAL

CROSS-REFERENCE TO RELATED APPLICATION

The present application claims priority from Japanese Patent Application No. JP 2007-264412 filed on Oct. 10, 2007, the content of which is hereby incorporated by reference into this application.

TECHNICAL FIELD OF THE INVENTION

The present invention relates to a semiconductor apparatus, a manufacturing technology of a semiconductor apparatus and a joint material. More particularly, it relates to a lead-free semiconductor apparatus provided with an electrode joint structure having a reflow resistance of about 260° C. and high reliability under thermal cycle test, a low-cost joint material capable of and low-temperature process for obtaining the joint structure, and a manufacturing technology of the semiconductor apparatus excellent in mass productivity.

BACKGROUND OF THE INVENTION

A power semiconductor apparatus typified by a power transistor package or the like has a packaging structure in which a rear-surface electrode of a semiconductor device having semiconductor elements formed longitudinally (in a direction vertical to a circuit surface of a semiconductor substrate) and a die pad of a lead frame are connected by die bonding, a main-surface electrode and a control electrode on a circuit surface side are electrically connected to respective external connection leads, and the entirety of the semiconductor device, the entirety or part of the die pads and a part of the external conduction lead are molded with insulating resin.

In the conventional die bonding of a power semiconductor apparatus with large or intermediate capacity, the soft high-Pb-content solder having the reflow resistance of about 260° C. and small thermal stress load to the semiconductor device has been used as a joint material. However, lead is a chemical substance harmful to environment and the use thereof is restricted under chemical substance regulation of each country typified by RoHS (Restriction of Hazardous Substances). Although the high-Pb-content solder is exceptionally excluded from the banned substances at present, the early shift to the lead-free material has been demanded. Alternative materials of the high-Pb-content solder have been considered all over the world, but no material capable of being applied to a product has been found out yet.

As the candidates of the lead-free material, Zn (zinc) series solder (for example, Japanese Patent Application Laid-Open Publication No. 2006-159201 (Patent Document 1)), Sn (tin)-Sb (antimony) series high-temperature solder (for example, Japanese Patent Application Laid-Open Publication No. 2005-340267 (Patent Document 2)) and high-conductive silver paste of resin adhesion type (for example, Japanese Patent Application Laid-Open Publication No. 2006-59905 (Patent Document 3)) have been known, and silver-nanoparticle bonding material utilizing the low-temperature fusion reaction of nanoparticles has been considered recently.

SUMMARY OF THE INVENTION

Although the Zn series solder and the Sn—Sb series high-temperature solder that are the candidates of an alternative material of a Pb-free substance have sufficient heat resistant properties better than the high-Pb-content solder, because the solder material itself is hard, they have a problem that the chip crack frequently occurs in a cooling process after the die bonding. Further, although the high-conductive silver paste has sufficient heat and electric conductivities and the reflow resistance of 260° C., it has the problem that the peeling occurs in a short time depending on the humidity environment and temperature cycle environment and required reliability cannot be obtained. Also, the recent silver nanoparticle bonding is the low-temperature bonding method achieved by filling silver nanoparticle to a bonding layer and then applying pressure and heat, and high bonding strength, high heat dissipation properties and high conductive properties can be obtained. However, since application of pressure is necessary in this process, batch processing cannot be performed, and the mass productivity is inferior due to the long bonding time.

As the characteristics required in the actual die bonding material and process of the semiconductor apparatus, the mass productivity equivalent to that of the conventional high-Pb-content solder is required in the production process. More specifically, characteristics such as (a) supply of the joint material is easy, (b) process temperature is 350° C. or lower in the light of heat resistant properties of the components, (c) joint can be made by the pressureless process in the light of the mass productivity, (d) large void failure does not occur in a joint layer in the light of the joint quality and others are required. Further, in order to ensure the electric properties and the long-term reliability required for the semiconductor apparatus in the completed product, characteristics such as (e) thermal stress relieving function for preventing the chip crack, (f) sufficient thermal fatigue life, (g) high conductivity and high heat dissipation more than those of high-Pb-content solder and others are required for the joint portion. The alternative material of the high-Pb-content solder has to be the lead-free joint material that can satisfy the characteristics (a) to (d) at the same time, and the joint portion of the semiconductor apparatus assembled with the joint material has to satisfy all the characteristics (e) to (g). In addition, it is needless to say that the completed product is preferably manufactured at low cost.

The first object of the present invention is to provide a lead-free joint material excellent in assembly properties of a semiconductor apparatus and a manufacturing method of a semiconductor apparatus excellent in mass productivity.

The second object of the present invention is to provide a semiconductor apparatus which incorporates a die-bonding structure having a reflow resistance of 260° C., achieves the solder free, sufficient reliability under thermal cycle test and heat dissipation properties, and can be manufactured at low cost.

The above and other objects and novel characteristics of the present invention will be apparent from the description of this specification and the accompanying drawings.

The typical ones of the inventions disclosed in this application will be briefly described as follows.

(1) In order to achieve the first object, a joint material that joints a semiconductor part and a conductive member by metal bonding is in paste form containing metallo-organic silver compound decomposed at a temperature of 350° C. or lower, well-conductive metal powders with a maximum particle diameter of 15 μm to 200 μm and organic solvent. Further, at least one of silver oxide fine powders with a particle diameter of 1 nm to 200 nm and metallic silver fine powders having organic films formed on their surfaces are added to the joint material in paste form.

Further, the metal powders may be the composite metal powders containing a core material mainly made of any one of copper, aluminum, nickel, silver, tungsten, molybdenum, magnesium and gold and a layer of silver, gold, platinum or palladium coated on the outermost surface of the core material or be the single metal powers of silver, gold, copper or nickel.

Further, a manufacturing method of a semiconductor apparatus for achieving the first object comprises the steps of:

(a) supplying the joint material in paste form onto a joint surface of the conductive member or the semiconductor part;

(b) pressing the semiconductor part or the conductive member onto the joint material in paste form, thereby mounting the semiconductor part or the conductive member thereon; and (c) jointing the semiconductor part and the conductive member by heating to 100° C. to 350° C. in an atmosphere, wherein an organic constituent in the joint material in paste form is removed, thereby jointing the semiconductor part and the conductive member by metal bonding.

Since the joint material is in paste form obtained by mixing metal powders with a large particle diameter and liquid metallo-organic silver compounds dissolved in organic solvent, the joint material can be easily supplied automatically onto the joint surface of the conductive member or the semiconductor part by a dispenser or a printing method. Also, the viscosity of the joint material in paste form can be adjusted by the additive amount of the organic solvent. Further, the well-conductive material is selected for metal powders, precious metal is coated on the surface thereof, and liquid metallo-organic silver compound dissociated at the temperature of 350° C. or lower is mixed thereto, thereby obtaining the joint material. Therefore, it is possible to prevent the oxidation of the joint material and to joint the semiconductor part and the conductive member by the good metal bonding of silver by the heat treatment in an atmosphere. The liquid metallo-organic silver compound has the nature of gathering in a narrow space of adjacent metal powders and a narrow space between the metal powder and the joint member (semiconductor part or conductive member) by the capillary action, and it can metallically bond the metal powders and the metal powder and the joint member efficiently with a small amount of silver even under the pressureless condition. Furthermore, when the fine powders of silver oxide and metallic silver are added, since the fine powders floating in the organic solvent have a nature of gathering in a narrow space like the metallo-organic silver compound, the metal bonding area by silver can be expanded. Therefore, since the die bonding is possible even by the heating in an atmosphere under the pressureless condition, the manufacturing method of a semiconductor apparatus excellent in mass productivity and lower cost compared to the conventional die bonding process of high-Pb-content solder that requires the reductive atmosphere can be provided. Also, since the metallo-organic silver compound is limited to the material with the decomposition temperature of 350° C. or lower, the metal bonding by the fusion of silver can be performed at a low temperature of 350° C. or lower and the joint can be made even when the semiconductor parts or the conductive members have the low heat resistant properties. Further, since the maximum particle diameter of the metal powder is as large as 15 μm to 200 μm, gaps are formed between the metal powders and the gas of the organic solvent gasified in the heating is easily exhausted to the outside through the gaps. Therefore, the formation of large voids due to the gas generated inside can be prevented. Although the wide spaces between metal powders remain as gaps, since the gaps are almost evenly dispersed in the bonding layer made of the joint material and heat and electric conductivities at a metallically bonded portion are five times as high as those of the high-Pb-content solder, the average heat and electric conductivities of the bonding layer are superior to those of the high-Pb-content solder, and the occurrence of the local overheating in the semiconductor apparatus can be prevented.

(2) In order to achieve the second object, the bonding layer in the semiconductor apparatus is made of well-conductive metal powders with the maximum diameter of 15 μm to 200 μm and silver functioning as a bonding material between metal powders and between metal powders and the semiconductor parts or the conductive members, and the minute gaps are dispersed in the bonding layer at the volume ratio of 5 vol % to 70 vol %.

Since the joint material is made of well-conductive metal powders and silver, the heat dissipation properties of the joint portion (bonding layer) between the semiconductor part and the conductive member can be improved by five times or more compared with the high-Pb-content solder. Therefore, even when about 70 vol % of gaps exist in the joint portion (bonding layer), the average heat dissipation properties of the joint portion (bonding layer) can be improved in comparison to the high-Pb-content solder as long as the joint portion (bonding layer) has the region connected by the metal bonding of 30%. If the gaps are concentrated on one spot and a large void is formed, the heat dissipation properties of the semiconductor device (chip) in its vicinity are decreased, and the elements are to be damaged due to overheating. However, since the metal powders with a large particle size do not move in the heat treatment of the die bonding and the gap is formed only between the metal powders, the occurrence of the void larger than the metal particle can be prevented, and it is possible to prevent the semiconductor device from being damaged.

Meanwhile, when the bonding layer is formed to have a porous structure in which gaps are evenly dispersed in the bonding layer, the bonding layer is deformed by the lower stress compared with the bulk structure, the inside of which is dense (structure with no gap or extremely small number of gaps), and the thermal strain caused by the difference in thermal expansion coefficient between the semiconductor device and the conductive member is absorbed by the bonding layer. Accordingly, the thermal stress applied to the semiconductor device can be significantly reduced.

Further, the constituent material of the bonding layer has a thermal fatigue life longer than that of the high-Pb-content solder, and the thickness of the bonding layer can be increased by adjusting the amount of joint material to be supplied and the pressing force when mounting the semiconductor device. Therefore, the reliability under thermal cycle test of the bonding layer can be sufficiently improved compared with the high-Pb-content solder.

The effects obtained by typical aspects of the present invention will be briefly described below.

The semiconductor part (chip) and the conductive member (die pad and others) are metallically bonded via a joint layer made of high-melting-point and well-conductive metal powders with the maximum particle diameter of 15 μm to 200 μm and a silver bonding material for connecting them, and the joint layer is configured to have the structure in which minute holes with the volume ratio of 5 vol % to 70 vol % are almost evenly dispersed. By this means, it is possible to provide the semiconductor apparatus with the reflow resistance of about 260° C. and excellent in high-temperature reliability and reliability under thermal cycle test.

Further, since the joint material is in paste form containing metal powders with the maximum particle diameter of 15 μm to 200 μm whose outermost surfaces are coated with precious metal, metallo-organic silver compound dissociated at the temperature of 350° C. or lower and solvent, the semiconductor part and the conductive member can be jointed at the low temperature of 350° C. or lower in the atmosphere without applying pressure, and it is possible to provide the manufacturing method of a semiconductor apparatus excellent in mass productivity and joint quality.

BRIEF DESCRIPTIONS OF THE DRAWINGS

FIG. 7 is an explanatory diagram showing the evaluation results of various types of joint materials used for the semiconductor apparatus according to an embodiment of the present invention;

DESCRIPTIONS OF THE PREFERRED EMBODIMENTS

Figure 1:
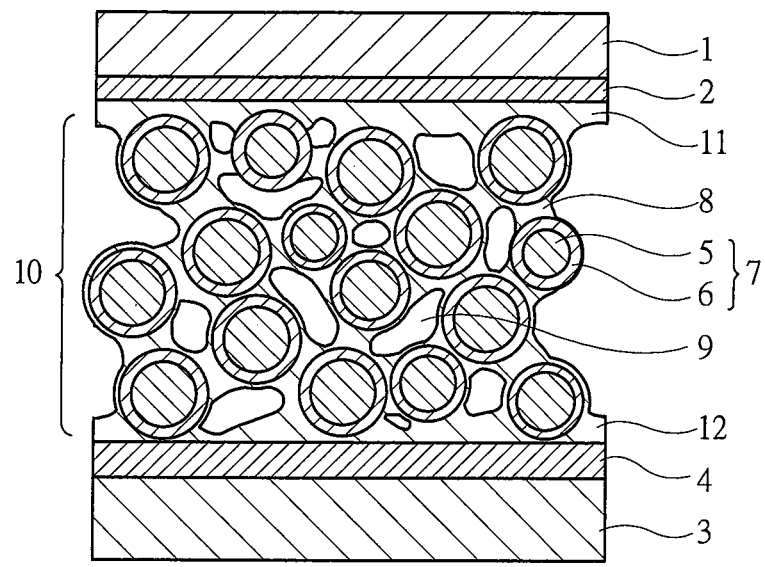
FIG. 1 is a cross-sectional view showing the principal part of the die bonding portion of a semiconductor apparatus according to the first embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Also, even when mentioning that constituent elements or the like are "made of A" or "comprise A" in the embodiments below, elements other than A are not excluded except the case where it is particularly specified that A is the only element.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Further, when referring to the material or the like, the specified material is a main material thereof unless otherwise stated or except the case where it is not so in principle and in situation, and other subsidiary element, additives, additional elements and others are not excluded. For example, a silicon member contains not only pure silicon but also additive impurities and binary and ternary alloys mainly made of silicon (for example, SiGe) unless otherwise stated.

Also, components having the same function are denoted by the same reference numbers throughout the drawings for describing the embodiments, and the repetitive description thereof will be omitted.

Further, in the drawings used in the embodiments, hatching is used in some cases even in a plan view so as to make the drawings easy to see.

Hereinafter, embodiments of the present invention will be described in detail with reference to the accompanying drawings.

First Embodiment

FIG. 1 shows an example of a cross-sectional structure of a die bonding portion in a semiconductor apparatus according to the first embodiment.

A chip (semiconductor part) 1 is formed of an Si (silicon) substrate about 4 mm and 5 mm on a side and about 0.26 mm thick, and semiconductor elements (power transistor elements such as power MOSFETs) are formed in a direction vertical to a surface of the Si substrate.

A rear-surface electrode 2 is configured to have a multilayered structure obtained by stacking an Al (aluminum) film, a Ti (titanium) film, an Ni (nickel) film and an Au (gold) film in this order from the side of the chip 1, and the Au film is the outermost film. Note that a V (vanadium) film may be used instead of the Al film.

A die pad (conductive member, second conductive member) 3 is formed of a lead frame made of Cu (copper) plated with Ni. Further, a plating film 4 made of Ag (silver) or Ni with a thickness of about 5 μm is formed on a surface of the die pad 3.

The chip 1 and the die pad 3 are electrically connected by composite metal powders 7 and adhesive layers 8, 11 and 12. Each of the composite metal powders 7 is formed of a Cu metal powder 5 with a diameter of about 5 μm to 50 μm and an Ag plating film 6 with a thickness of about 2 μm coated around the Cu metal powder 5, so that the composite metal powder 7 has a high melting point and is well-conductive. The adhesive layers 8, 11 and 12 are adhesive layers (bonding material) made of Ag paste. Also, holes 9 are formed in the adhesive layers 8, 11 and 12. The joint layer (bonding layer) 10 between the chip 1 and the die pad 3 is composed of the composite metal powders 7, the adhesive layers 8, 11 and 12 and the holes 9. In the first embodiment, the maximum size of the hole 9 in the joint layer 10 is smaller than the size of the composite metal powder 7, and the volume ratio of the holes 9 in the joint layer 10 is about 20% to 40%. Most of the holes 9 are connected to each other and are almost evenly dispersed in the joint layer 10. The thickness of the joint layer 10 is adjusted to be several times as large as the diameter of the largest composite metal powder 7 and is, for example, about 150 μm in the first embodiment. The thickness of the joint layer 10 is not changed in the heat treatment process and is determined by the thickness at the time when the chip 1 is mounted and then pressed. Note that the power transistor elements applicable in the present embodiment are those having a rear-surface electrode surface covered with precious metal and a longitudinal structure which can supply the current of several A or more to the rear-surface electrode, and for example, a MOSFET of an Si device, IGBT, a bipolar transistor, an SIC device and GaN device operating at a high temperature can be used.

Figure 2:
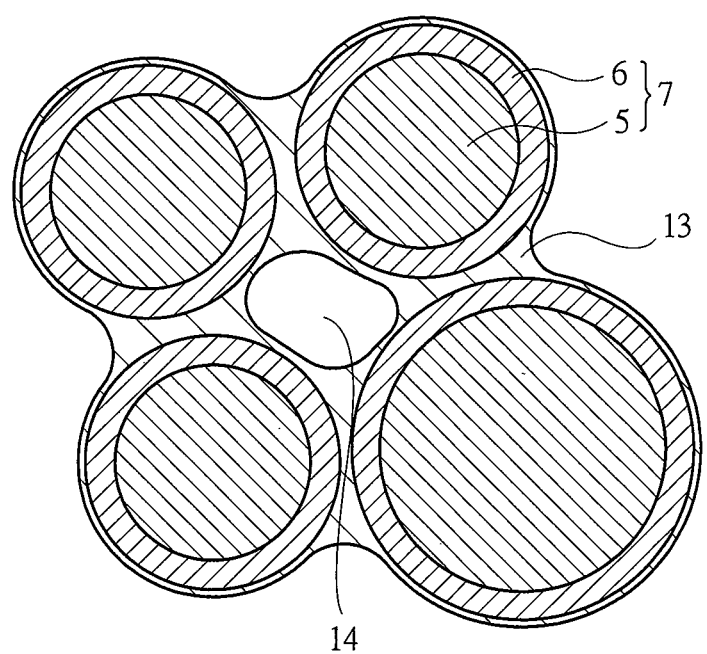
FIG. 2 is an explanatory diagram schematically showing a state of the composite metal powders and the metallo-organic silver compound solution during the sintering process used for the die bonding portion of the semiconductor apparatus according to the first embodiment of the present invention.

FIG. 2 schematically shows a state of the composite metal powder 7 in the sintering process and the metallo-organic silver compound 13 melt in organic solvent into liquid form. In the assembly process of the semiconductor apparatus, the composite metal powders 7 in paste form supplied onto the die pad 3 are first coordinated in a stable state of being stacked by their own weight with a high filling density, and the liquid metallo-organic silver compound 13 buries the circumferences of the powders. Even when the chip 1 is mounted and pressed to the die pad 3, the filling state of the composite metal powders 7 is almost unchanged. Although FIG. 2 shows the state where the organic solvent is gasified in the heating process and the amount of liquid is reduced, the composite metal powders 7 cannot move because they are constrained by the adjacent composite metal powders 7, and only the liquid metallo-organic silver compound 13 moves into the narrow region between the composite metal powders 7 by the capillary action. When the liquid amount is further reduced, gaps 14 formed between the composite metal powders 7 are coupled to form a route leading to the outside, and the state where the air passes to the inside of the joint layer 10 is achieved. The nonvolatile organic constituent in the metallo-organic silver compound 13 burns and is gasified by the oxygen supply and is exhausted from the inside of the joint layer 10. As a result, the organic constituent is excluded from the joint layer 10 and the fusion of silver rapidly proceeds, so that the adhesive layers 8, 11 and 12 are formed. In the structure of the joint layer 10, finally, Ag is concentrated on the narrow space between the composite metal powders 7 to efficiently couple the composite metal powders 7, thereby forming the network-like structure. The wide space between the composite metal powders 7 remains as the hole 9 mentioned above. The volume ratio of the holes 9 is determined by the viscosity distribution of the composite metal powders 7 and the volume ratio of the Ag constituent to be the bonding material, and it can be adjusted.

As described above, since the materials to be the joint layer 10 can be supplied as metal paste onto the die pad 3, the automatic supply by the dispenser and the printing method can be easily performed. Further, the viscosity of the paste can be adjusted by the additive amount of the organic solvent.

According to the first embodiment, the joint material (joint layer 10) for the die bonding of the chip 1 is made of high-melting-point and high-conductive Cu and Ag, and although the ratio of the holes 9 in the joint layer 10 is high, since the metal bonding of silver is utilized as the bonding mechanism (adhesive layers 8, 11 and 12) of the composite metal powders 7, it is possible to provide the lead-free semiconductor apparatus excellent in heat resistant properties and heat dissipation and conductive properties.

Further, since the yield stress of Ag is low and the chip 1 and the die pad 3 are jointed by the network structure in which Cu particles are connected by Ag in the joint layer 10, the flexibility can be provided to the mechanical properties of the joint layer 10. In this manner, since the thermal strain generated between the chip 1 and the die pad 3 of the lead frame can be absorbed by the joint layer 10, it is possible to prevent the large thermal stress from being applied to the chip 1. Further, even when the thermal strain repeatedly occurs, the maximum strain amount in the joint layer 10 is smaller in the above-described network structure in comparison to the bulk structure having no hole 9, and the fatigue life of Ag of the member to be strained (it is at the time when crack is formed in Ag that fatigue occurs) is longer than that of the high-Pb-content solder. Therefore, the semiconductor apparatus with high reliability under thermal cycle test can be provided. Also, though the joint material (joint layer 10) contains Ag of several % to several tens %, since it is mainly made of Cu powders, the material cost can be reduced compared with the Ag paste and the nano-Ag particle bonding material.

Note that, in the structure of the first embodiment shown in FIG. 1, the material obtained by forming the Ag plating films 6 around the Cu metal powders 5 is used for the composite metal powders 7, but it is also possible to use the material obtained by performing the zincate treatment to the Al metal powders and performing the electroless plating treatment of Ni and Au. Since Al is a more flexible material than Cu, the thermal stress applied to the chip 1 can be suppressed even when the thickness of the joint layer 10 is reduced, and since the thermal fatigue life of Al is longer than that of the high-Pb-content solder, the highly reliable semiconductor apparatus can be provided. Also, since Al is a lower cost material than Cu and the thickness of the joint layer can be reduced, the amount of joint material necessary for the die bonding can be reduced, and the material cost required for the assembly of the apparatus can be reduced.

Second Embodiment

Figure 3:
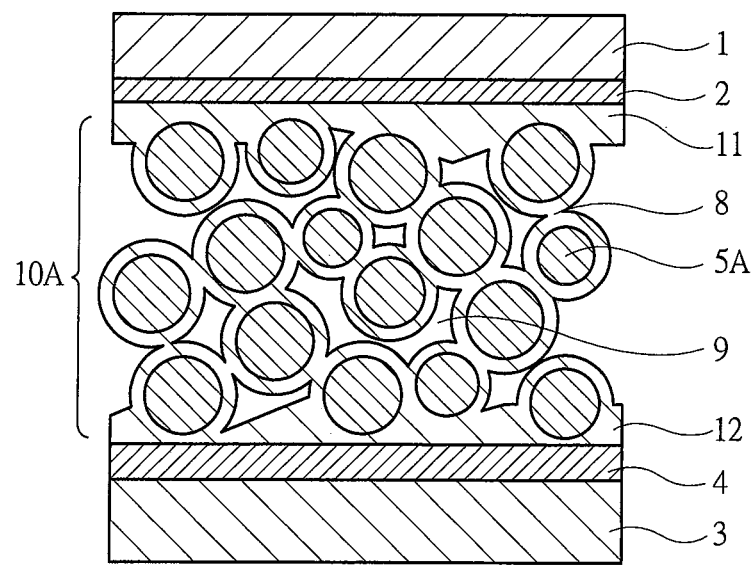
FIG. 3 is a cross-sectional view showing the principal part of the die bonding portion of a semiconductor apparatus according to the second embodiment of the present invention.

FIG. 3 shows an example of a cross-sectional structure of a die bonding portion in a semiconductor apparatus according to the second embodiment.

In FIG. 3, the chip 1, the rear-surface electrode 2, the die pad 3 and the plating film 4 are the same as those described in the first embodiment with reference to FIG. 1.

The chip 1 and the die pad 3 are electrically connected by single metal powders 5A and the adhesive layers 8, 11 and 12, and the joint layer (bonding layer) 10A between the chip 1 and the die pad 3 is formed of the single metal powders 5A, the adhesive layers 8, 11 and 12, and the holes 9. The single metal powders 5A are made of Cu single metal powders with a diameter of about 10 μm to 100 μm fabricated by the atomize method, and the surface thereof is coated with precipitated and fused Ag. In the assembly process of a semiconductor apparatus, when the heat treatment is performed in an atmosphere, the surface of Cu is oxidized and an oxide film is formed, so that the oxide film is peeled. For the prevention of the problem, the atmosphere is changed to a reductive atmosphere in the course of the heat treatment. The weight ratio of Ag in the bonding material (joint layer 10A) is set to about 20% with respect to Cu so that the ratio of the holes 9 in the joint layer 10A becomes about 10 vol % to 30 vol %. However, since there is a limit to increase the weight ratio of Ag only by the increase of the metallo-organic silver compound 13 (see, FIG. 2), fine particles of silver oxide with a particle diameter of about 10 nm to 1000 nm are added. Note that the fine particles of silver oxide are reduced during the heat treatment, and the fine particles of silver oxide themselves have the self-reduction action. Also, in the second embodiment, the joint layer 10A is formed to have a thickness of about 100 μm.

In the second embodiment, since the Cu single metal powders 5A are used for the metal powders in the joint material (joint layer 10A) for the die bonding of the chip 1, although the change to the reductive atmosphere is necessary in the joint (die bonding) process, the material cost can be significantly reduced compared with the case where the surface is coated with precious metal (Ag) as described in the first embodiment, and the semiconductor apparatus can be provided at low cost.

Third Embodiment

Figure 4:
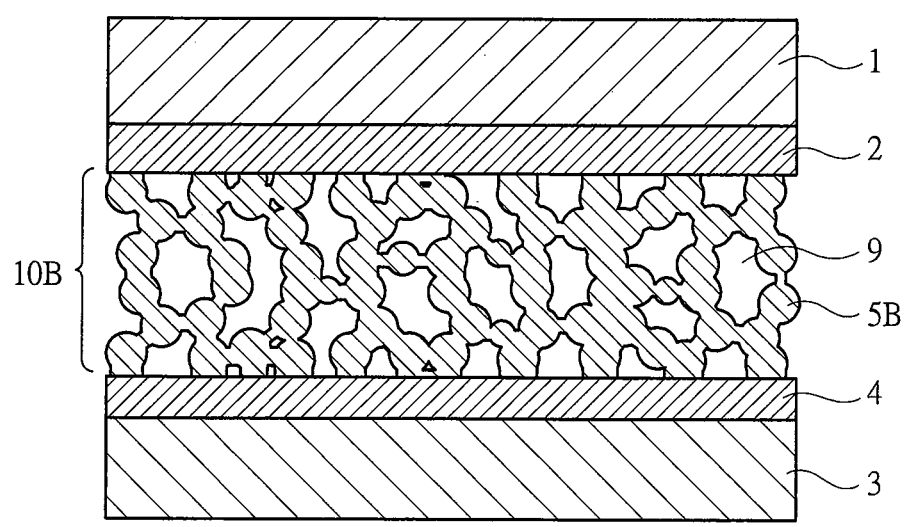
FIG. 4 is a cross-sectional view showing the principal part of the die bonding portion of a semiconductor apparatus according to the third embodiment of the present invention.

FIG. 4 shows an example of a cross-sectional structure of a die bonding portion in a semiconductor apparatus according to the third embodiment.

In FIG. 4, the chip 1, the rear-surface electrode 2, the die pad 3 and the plating film 4 are the same as those described in the first embodiment with reference to FIG. 1.

In the third embodiment, silver metal powders 5B are used for the joint material (joint layer 10B). Therefore, the internal structure of the joint layer (bonding layer) 10B appears similar to that of an adhesive layer made of Ag with many gaps.

According to the third embodiment, the chip 1 and the die pad 3 are bonded by only mechanically flexible Ag, and the inside of the joint layer 10B is formed to have a porous structure (holes 9 are formed) and is easily deformed. Therefore, the thermal stress load applied to the chip 1 can be reduced, and the thickness of the joint layer 10B can be determined by the thickness at the time when the chip 1 is mounted on the die pad 3. Accordingly, it is possible to easily fabricate a semiconductor apparatus with a thickness of about 100 μm. Also, the semiconductor apparatus having the significantly improved reliability under thermal cycle test can be provided.

Fourth Embodiment

Figure 5:
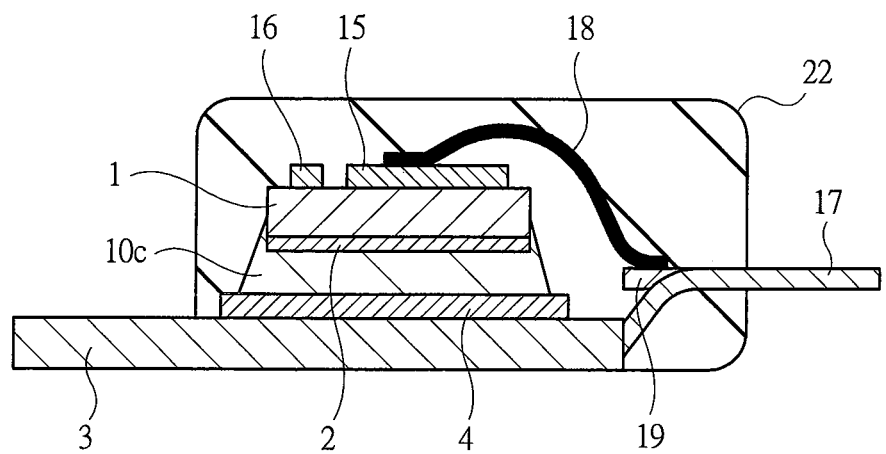
FIG. 5 is a cross-sectional view showing the package structure of a semiconductor apparatus according to the fourth embodiment of the present invention.
Figure 6:
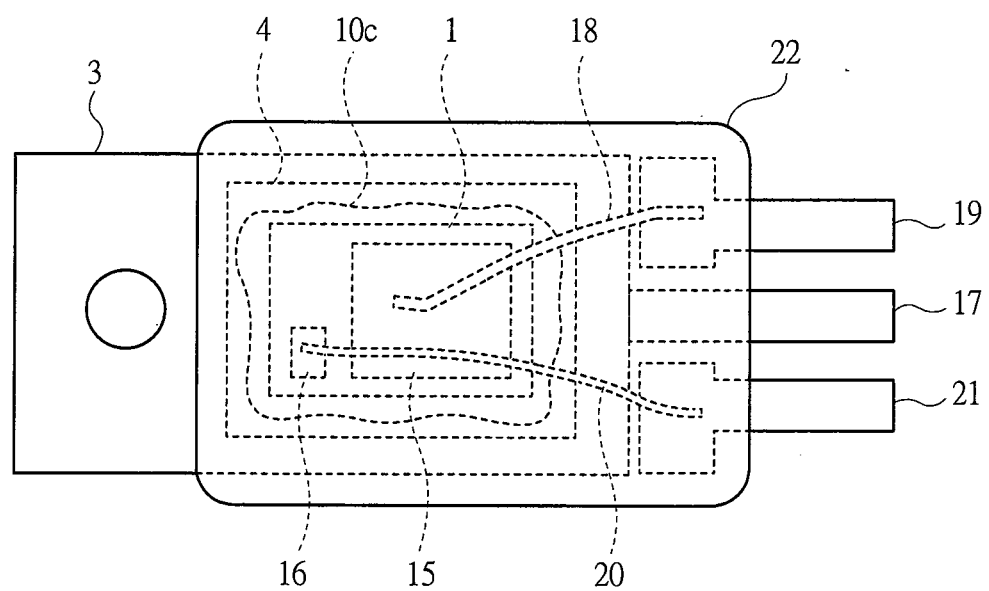
FIG. 6 is a plan view showing the package structure of the semiconductor apparatus according to the fourth embodiment of the present invention.

FIG. 5 and FIG. 6 are a cross-sectional view and a plan view respectively showing an example of a packaging structure of a semiconductor apparatus according to the fourth embodiment.

In FIG. 5, the chip 1, the rear-surface electrode 2, the die pad 3 and the plating film 4 are the same as those described in the first embodiment with reference to FIG. 1.

In the chip 1, a main-surface electrode 15 and a control electrode 16 made of Al are formed on a main surface reverse to a surface on which the rear-surface electrode 2 is formed. A lead for rear-surface electrode 17 is electrically connected to the die pad 3 and the rear-surface electrode 2 and leads out the terminal on the rear surface of the chip 1 to the outside of the package. The main-surface electrode 15 is electrically connected to a lead for main-surface electrode (conductive member, first conductive member) 19 by a wire 18 made of Al, and the lead for main-surface electrode 19 leads out the terminal of the main-surface electrode 15 to the outside of the package. The control electrode 16 is electrically connected to a lead for control electrode 21 by a wire 20 made of Al, and the lead for control electrode 21 leads out a terminal of the control electrode 16 to the outside of the package. The lead for main-surface electrode 19 and the lead for control electrode 21 are formed from a lead frame together with the die pad 3 and are made of, for example, Cu. A joint layer (bonding layer) 10C with a thickness of about 100 μm is formed of composite metal powders obtained by coating Al core balls (Al powders) with Ni and Au (Au is on an external side) by electroless plating and an Ag joint layer, and the ratio occupied by the holes 9 (see, FIG. 1) in the layer is about 30%. These chip 1, die pad 3 and wires 18 and 20 are encapsulated with molding resin 22.

In the fourth embodiment, the bonding layer 10C obtained by coupling the Al powders with Ag is used for a die bonding portion of the chip 1. Therefore, it is possible to provide a semiconductor apparatus with superior properties such as a reflow resistance of nearly 300° C., high-temperature endurance reliability of 200° C. that is close to the heat resistance limit of the resin (molding rein 22), and reliability under severe thermal cycle test of about −55° C. to about 200° C. In particular, it is possible to provide a semiconductor package applicable to a semiconductor apparatus placed under server environments, for example, in a vehicle.

Further, the joint material can be formed of inexpensive Al and about 10% of Ag, and the assembling can be made by the heating of about 200° C. to about 250° C. in an atmosphere. Therefore, the process cost can be reduced in comparison with the bonding process of the high-Pb-content solder, and the highly-reliable solder-free semiconductor package can be provided at low cost.

Further, it is also possible to fill other resin at least in the holes 9 in the peripheral region of the joint layer 10C in advance before the encapsulation with the molding resin 22. In this manner, it is possible to prevent the trouble that moisture invades in the holes 9 in the joint layer 10C at the time of the encapsulation of the molding resin 22. If the moisture invades into the holes 9, the moisture evaporates and expands under the high-temperature condition, and due to the difference in the thermal expansion coefficient from the joint layer 10C, the distortions and cracks are caused in the joint layer 10C, and thus, the excessive stress is applied to the chip 1. However, when the resin filling process mentioned above is performed in advance before the encapsulation with the molding resin 22, it is possible to prevent the above-mentioned trouble. In other words, the high-temperature endurance reliability and the reliability under thermal cycle test of the semiconductor package can be further improved.

Fifth Embodiment

FIG. 7 is a table showing the evaluation results of various types of joint materials including the composite metal powders 7 (see FIG. 1) and the single metal powders 5A (see FIG. 3) described in the first to third embodiments. In FIG. 7, No. 1 to No. 7 are composite metal powders obtained by forming an Ag plating film around Cu metal powders, No. 8 is composite metal powders obtained by performing the zincate treatment to the Al metal powders and performing the electroless plating treatment of Ni and Au, No. 9 is composite metal powders obtained by forming an Au plating film around Ni metal powders, No. 10 is single metal powders of Ag, and No. 11 and No. 12 are single metal powders of Cu. These metal powders are all fabricated by the atomize method, and the particle sizes thereof are represented by the mesh size of the screen.

As shown in FIG. 7, in the case where the particle size of the metal powders is about 10 µm or less, when the liquid organic metal compound (for example, metallo-organic silver compound 13 (see FIG. 2)) is moved by the gas volatilized from the Ag paste to be the joint material (adhesive layers 8, 11 and 12 (see FIGS. 1 and 2)), the metal powders are also moved together and a region in which the metal powders are insufficient is formed at the central portion of the chip 1, and the region is finally left as a void failure. When such a large void is locally formed, the semiconductor element formed in the chip 1 just above the void is damaged by heat, and a defective product will be formed. Further, when the particle diameter of the metal particles is 300 µm or more, although it depends on the viscosity distribution, the failure of increasing the size of the holes 9 (see FIGS. 1, 3 and 4) occurs, and the semiconductor element in the chip 1 is damaged in a certain rate. Therefore, it can be understood that the maximum particle size of the metal powders is suitably about 15 µm to 200 µm.

The supply form of Ag to be the boding material (adhesive layers 8, 11 and 12) of the metal powders includes the metallo-organic silver compound solution, silver oxide fine powders and metallic silver fine particles. Since the volume of the metallo-organic silver compound solution is reduced to about $\frac{1}{1000}$ with respect to the initial volume when it is changed to the Ag amalgam, there is a limit of increasing the supply amount of Ag of the bonding material only by the metallo-organic silver compound, and it is necessary to repeat the process of supplying the metallo-organic silver compound solution to the joint portion and sintering the same for increasing the joint strength. Also, in the case of only the silver oxide fine powders and the metallic silver fine particles (nano-silver), the adjustment of the viscosity is difficult even when the volatile solvent is added, and a problem arises in the supply capability of the joint material. Further, the silver fine particles cannot be efficiently gathered in the narrow spaces of the metal powders under an pressureless condition, and only a part of the fine powders of Ag can be utilized for the bonding. Therefore, it can be understood that the supply form of Ag is preferably that obtained by adding at least one of silver oxide fine powders and metallic silver fine powders having organic films formed on the surfaces thereof to the metallo-organic silver compound or only the metallo-organic silver compound solution. As the materials of the metal powders, in addition to Cu, Al, Ni and Ag, W (tungsten), Mo (molybdenum), Mg (magnesium) and Au are preferable in view of the good heat and electric conductivities. However, in order to ensure the bonding properties with Ag, the outermost surface thereof has to be coated with one or more precious metals of Ag, Au, Pd (palladium) and Pt (platinum) by plating or other means. When any of the metal powders coated with these precious metals are used as the joint material, the joint process (die bonding) can be performed in an atmosphere. When the Cu metal powders not coated with precious metal are used for the joint material, the joint process only in an oxidation atmosphere is difficult, but the joint portion excellent in strength, heat dissipation properties and reliability can be obtained by changing the atmosphere to the reductive atmosphere during the heating process (see No. 12 in FIG. 7). Note that the ratio between the metal powders and Ag of the bonding material is preferably set in the range from 100:1 to 100:100 in volume ratio. When the amount of Ag is too large, the exhaustion route of the gas generated at the time of heating is difficult to be formed, and the chip 1 is pushed up and large voids are formed. Meanwhile, when the amount of Ag is too small, the strength and the heat dissipation properties are decreased due to the insufficient bonding material.

Figure 8:
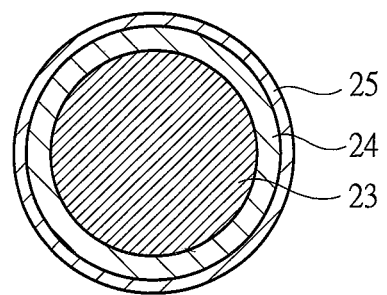
FIG. 8 is a cross-sectional view showing an example of a cross-sectional structure of a composite metal powder contained in the joint material used for a semiconductor apparatus according to the fifth embodiment of the present invention.

FIG. 8 shows an example of a cross-sectional structure of a composite metal powder obtained by applying precious metal coating to a metal powder. This composite metal powder is formed of a core metal powder 23, a base plating film 24 coated on a surface of the core metal powder 23 and a precious metal plating film 25 coated on a surface of the base plating film 24. When the core metal powder 23 is Al, after Zn is applied as a base film by zincate treatment, an Ni plating film (corresponding to base plating film 24) is formed by displacement plating, and than an electroless Au plating film (corresponding to precious metal plating film 25) is formed thereon. It is also preferable to perform the displacement plating of Ag after performing Cu flash plating process instead of the electroless Au plating film. When the core metal powder 23 is Cu, an electroless Ni plating film (corresponding to base plating film 24) and an electroless Au plating film (corresponding to precious metal plating film 25) or an electro Ni plating film (corresponding to base plating film 24) and an electro Ag plating film (corresponding to precious metal plating film 25) are suitable. In the case of Cu, the direct Ag plating is also possible. Also when the core metal powder 23 is Mo or W, it is preferable that the precious metal plating film 25 is formed by the plating process of Ag or Au after forming an Ni plating film as the base plating film 24 in the light of the adhesion between the base plating film 24 and precious metal plating film 25 and the core metal powder 23.

According to the present embodiment, the major part of the joint material can be made of the inexpensive metal powders, and the die bonding and other joints can be performed in an atmosphere and under the pressureless condition. Therefore, the semiconductor apparatus can be manufactured at low material cost and process cost, and the product cost of the semiconductor apparatus can be reduced.

Sixth Embodiment

Figure 9:
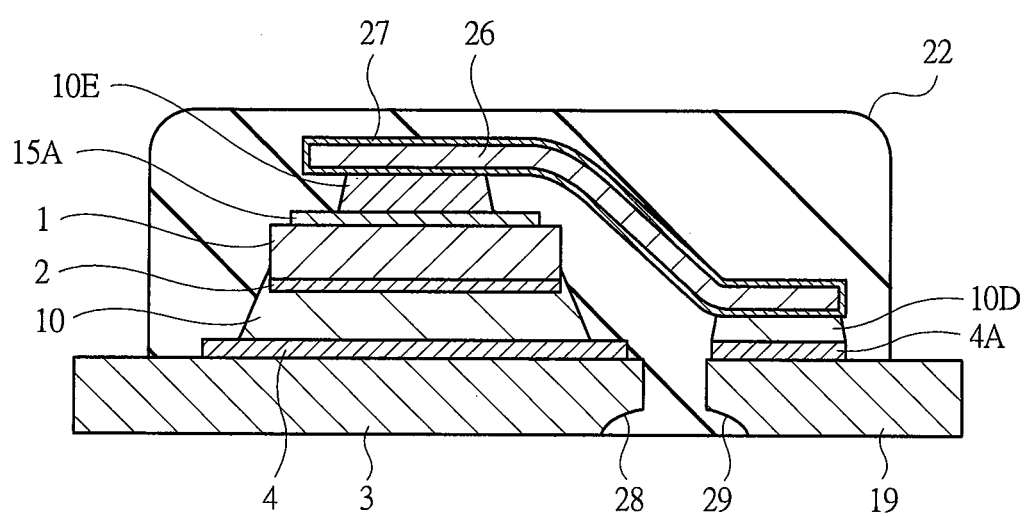
FIG. 9 is a cross-sectional view showing the package structure of a semiconductor apparatus according to the sixth embodiment of the present invention.

FIG. 9 is a cross-sectional view showing a packaging structure of a semiconductor apparatus according to the sixth embodiment.

In FIG. 9, the chip 1, the rear-surface electrode 2, the die pad 3, the plating film 4 and the joint layer 10 are the same as those described in the first embodiment with reference to FIG. 1. Also, the molding resin 22 is the same as that described in the fourth embodiment with reference to FIG. 5. The joint layer 10 may be the same as the joint layer 10A described in the second embodiment with reference to FIG. 3.

In the chip 1, on a main surface reverse to the surface on which the rear-surface electrode 2 is formed, a main-surface electrode 15A is formed by performing the zincate treatment on an Al film and forming an Ni film and an Au film by the electroless plating. The main-surface electrode 15A is electrically connected to the lead for main-surface electrode 19 by a plate-shaped electrode 26 made of Cu, and the lead for main-surface electrode 19 leads out the terminal of the main-surface electrode 15A to the outside of the package. A plating film 27 formed of an Ni film and an Ag film (Ag film is on an external side) is formed on the surface of the plate-shaped electrode 26. On a part of a surface of the lead for main-surface electrode 19 to which the plate-shaped electrode 26 is connected, a plating film 4A similar to the plating film 4 is formed, and the plate-shaped electrode 26 and the lead for main-surface electrode 19 are connected by a joint layer (bonding layer) 10D similar to the joint layer 10 (or joint layer 10A) disposed between the plating film 4A and the plate-shaped electrode 26. Further, a joint layer (bonding layer) 10E disposed between the main-surface electrode 15A and the plate-shaped electrode 26 and connecting the main-surface electrode 15A and the plate-shaped electrode 26 is also similar to the joint layer 10 (or joint layer 10A) described above. Counterbores 28 and 29 formed in the die pad 3 and the lead for main-surface electrode 19 are provided in order to prevent the molding resin 22 from peeling from the semiconductor apparatus.

According to the sixth embodiment described above, the joint portions of each member in the semiconductor apparatus are uniformly formed to have the structure (joint layers 10 (or joint layer 10A), 10D, 10E) in which the composite metal powders 7 made of the Cu metal powders 4 and the Ag plating film 6 (see FIG. 1) or the single metal powders 5A made of Cu (see FIG. 3) and the bonding mechanism of Ag (adhesive layers 8, 11 and 12 (see FIG. 1 and FIG. 3)) are metallically bonded. By this means, the joint of all the joint portions in the semiconductor apparatus can be made by one joint process. This is because only the metallo-organic silver compound 13 (see FIG. 2) flows and the composite metal powders 7 (or single metal powders 5A) do not move in the joint process, and therefore the occurrence of positional shift of the chip 1 can be prevented. As a result, the manufacturing cost of the semiconductor apparatus can be reduced.

Also, by means of the structure in which electrodes on the front and rear sides of the chip 1 (main-surface electrode 15A and rear-surface electrode 2) are connected to the Cu members (plate-shaped electrode 26 and die pad 3) with large areas, the on-resistance in the operation of the device (chip 1) can be significantly reduce, and at the same time, by means of the structure in which the Si member (chip 1) is sandwiched between the Cu members (plate-shaped electrode 26 and die pad 3), the thermal stress can be relieved by the joint layers 10 (or joint layer 10A), 10D and 10E having a flexible structure with a high porosity (holes 9 (see FIG. 1 and FIG. 3)) even when the thermal stress applied to the semiconductor apparatus is severe. Therefore, the highly reliable semiconductor apparatus excellent in the electric properties can be provided.

Seventh Embodiment

Figure 10:
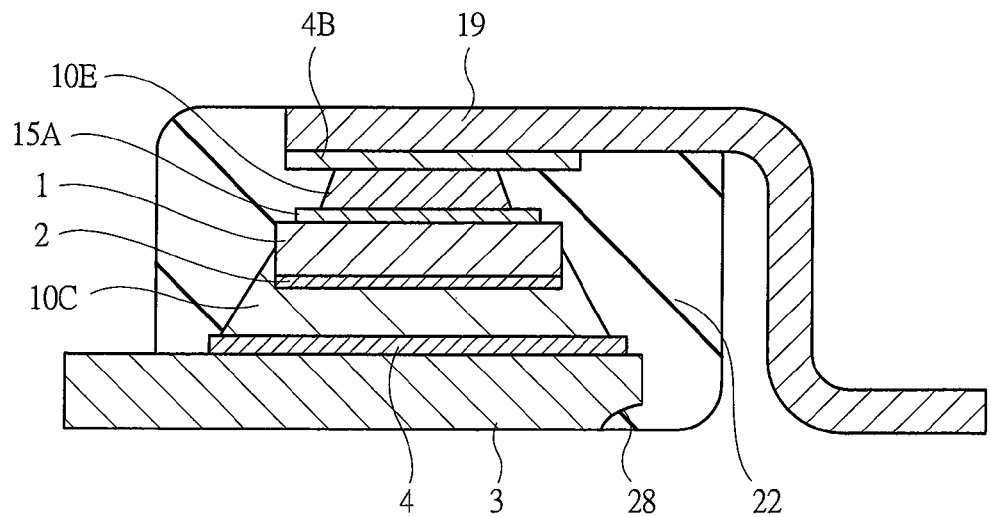
FIG. 10 is a cross-sectional view showing the package structure of a semiconductor apparatus according to the seventh embodiment of the present invention.

FIG. 10 is a cross-sectional view showing a packaging structure of a semiconductor apparatus according to the seventh embodiment.

In FIG. 10, the chip 1, the rear-surface electrode (second electrode) 2 on a rear surface (second main surface) of the chip 1, the die pad 3 (including counterbore 28), the plating film 4, the main-surface electrode 15A and the molding resin 22 are the same as those described in the first embodiment and the sixth embodiment with reference to FIG. 1 and FIG. 9. The joint layer 10C is the same as the joint layer 10C described in the fourth embodiment with reference to FIG. 5 and FIG. 6, and it is formed of the composite metal powders obtained by coating Al core balls (Al powders) with Ni and Au (Au is on an external side) by electroless plating and an adhesive layer made of Ag.

The lead for main-surface electrode 19 extends from the outside of the molding resin 22 to the position above the main-surface electrode (first electrode) 15A on the main surface (element forming surface (first main surface)) of the chip 1, and a plating film 4B similar to the plating film 4 described above and the plating film 4A described in the sixth embodiment is formed on the surface of the lead 19 at the position opposite to the main-surface electrode 15A. A joint layer (bonding layer) 10E similar to the joint layer 10C is disposed between the plating film 4B (lead for main-surface electrode 19) and the main-surface electrode 15A, and the plating film 4B and the main-surface electrode 15A are jointed by this joint layer 10E. Further, in the seventh embodiment, the thickness of the joint layers 10C and 10E is about 100 μm to 500 μm, and the joint layers 10C and 10E contain minute gaps with the porosity of about 50 vol % to 70 vol %. With the porosity described above, even when the lead for main-surface electrode 19 becomes thick and the thermal stress applied to the joint layer 10E and the chip 1 is increased, the joint layer 10E can absorb the thermal stress.

According to the seventh embodiment described above, the lead frames (die pad 3 and lead for main-surface electrode 19) are jointed to the electrodes (main-surface electrode 15A and rear-surface electrode 2) on the front and rear surfaces of the chip 1 by the metal bonding via the joint layers 10C and 10E made of the composite metal powders containing Al as core balls and an Ag joint layer. Therefore, it is possible to provide the low-loss semiconductor apparatus in which the package resistance in the operation is reduced as much as possible.

Simultaneously, since the joint portions (joint layers 10C and 10E) are mainly composed of a thick porous Al layers containing minute gaps with the porosity of about 50 vol % to 70 vol %, the distortion due to the difference in thermal expansion coefficient between Cu and Si can be absorbed by the deformation of the joint layers 10C and 10E, and the semiconductor apparatus excellent in the reliability under thermal cycle test and high-temperature reliability can be provided. Further, since the metal leads (die pad 3 and lead for main-surface electrode 19) above and below the semiconductor apparatus are exposed from the molding resin 22, the semiconductor apparatus has good cooling properties, which makes it possible to provide a small-sized semiconductor apparatus with large current capacity.

Eighth Embodiment

Figure 11:
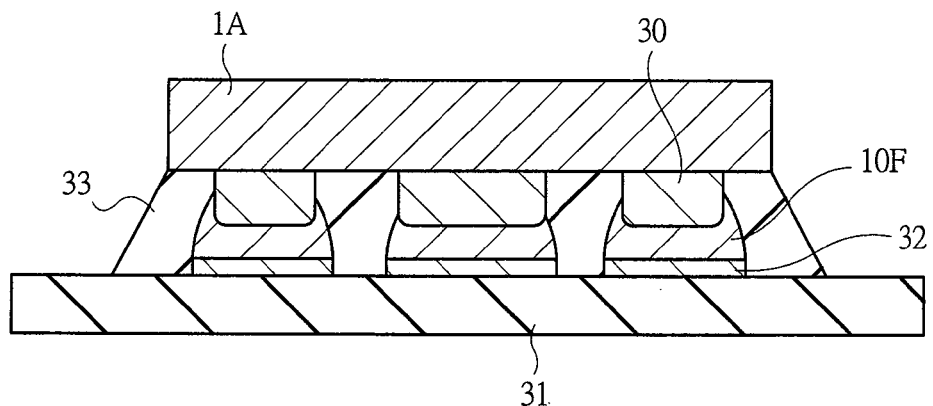
FIG. 11 is a cross-sectional view showing the flip-chip mounting structure of a semiconductor apparatus according to the eighth embodiment of the present invention.

FIG. 11 is a cross-sectional view showing an example of a flip-chip mounting structure of a semiconductor apparatus according to the eighth embodiment.

The chip (semiconductor part) 1A is a compound semiconductor chip in which elements for a high-frequency device are formed and is flip-chip mounted (surface mounted) on joint terminals 32 on a surface of a ceramic multi-layered substrate 31 via a plurality of bump electrodes 30 formed on a main surface (element forming surface) thereof. The bump electrodes 30 are made of Au formed by, for example, a plating method. The joint terminals 32 are configured to have a structure in which an Ni film and an Au film (Au film is on an external side) are formed on a surface of a Cu film by a plating method.

The joint layer (bonding layer) 10F is the same as the joint layer 10 described in the first embodiment or the joint layer 10A described in the second embodiment. The maximum particle diameter of the Cu metal powders in the joint layer 10F is about 15 μm, and the volume ratio between Cu and Ag in the joint layer 10F is about 1:1, and the porosity is restricted to about 5 vol % to 10 vol %. The low porosity in spite of the high Ag content in the joint layer 10F is achieved by the structure of the joint portion between the bump electrodes 32 and the joint terminals 32, and since the bonding area therebetween is small, the gas generated inside the joint portions can be easily exhausted to the outside. Further, an underfill resin 33 is filled in the space below the chip 1A mounted on the ceramic multi-layered substrate 31.

According to the eighth embodiment described above, the flip-chip mounting structure with high heat resistant properties can be realized. Further, since the chip 1A is mounted with the joint layer 10F with good thermal and electric conductivities, the packaging structure excellent in heat dissipation properties can be provided for the semiconductor apparatus including high-frequency devices that generate large amount of heat.

Ninth Embodiment

Figure 12:
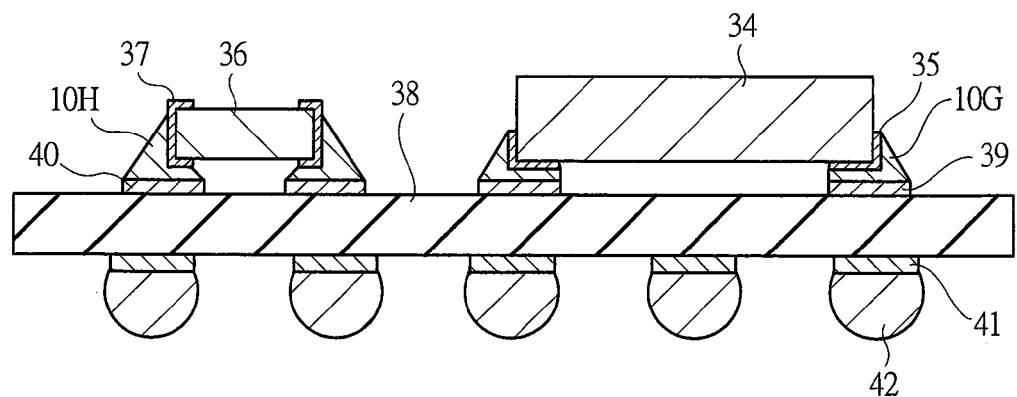
FIG. 12 is a cross-sectional view showing the chip mounting structure in a semiconductor apparatus according to the ninth embodiment of the present invention.

FIG. 12 is a cross-sectional view showing an example of a semiconductor module according to the ninth embodiment.

A semiconductor package (semiconductor part) 34 is a leadless semiconductor package and is provided with joint terminals 35 plated with Ni and Au. A passive element (semiconductor part) 36 is a chip element in which a resistor, a capacitor, an inductor or others is formed and is provided with joint terminals 37 similar to the joint terminal 35. An organic wiring board 38 is provided with joint terminals 39 and 40 plated with Ni and Au on the main surface thereof. The joint terminal 35 of the semiconductor package 34 is electrically connected to the joint terminal 39, and the joint terminal 37 of the passive element 36 is electrically connected to the joint terminal 40. On a rear surface of the organic wiring board 38, solder bump electrodes 42 are provided via terminals for solder bump electrode 41.

Joint layers (bonding layers) 10G and 10H are made of Cu metal powders with a particle diameter of about 1 μm to 20 μm plated with Ni and Au on their surfaces and adhesive layers made of Ag (similar to adhesive layers 8, 11 and 12 shown in FIG. 1).

In the assembly of the semiconductor module described above, a paste material obtained by mixing the Cu metal powders, the metallo-organic sliver compound solution and the metallic silver fine particles is applied onto the joint terminals 39 and 40 formed on the main surface of the organic wiring board 38, the semiconductor package 34 and the passive element 36 are aligned and mounted thereon by pressing the same from above, and after releasing the load, the heat treatment is performed in a conveyor chamber in an atmosphere in which preheating temperature is set to about 100° C. and peak temperature is set to about 250° C. Thereafter, the organic wiring board 38 is inverted, and flux is applied onto the terminals for solder bump electrode 41 on the rear surface. Then, solder balls made of Sn (tin)-Ag—Cu are mounted and heated to about 250° C. in a conveyor chamber in a nitrogen atmosphere to reflow the solder balls, thereby forming the solder bump electrodes 42.

According to the ninth embodiment described above, the semiconductor package 34 and the passive element 36 can be mounted by the low-temperature process of 350° C. or lower. Also, since the heat resistant properties of 300° C. or higher can be achieved in the joint portions (joint layers 10G and 10H) between the semiconductor package 34 and passive element 36 and the organic wiring board 38 (joint terminals 39 and 40), it is possible to provide the semiconductor module in which the secondary mounting of about 260° C. can be performed using the organic wiring board 38.

Tenth Embodiment

Figure 13:
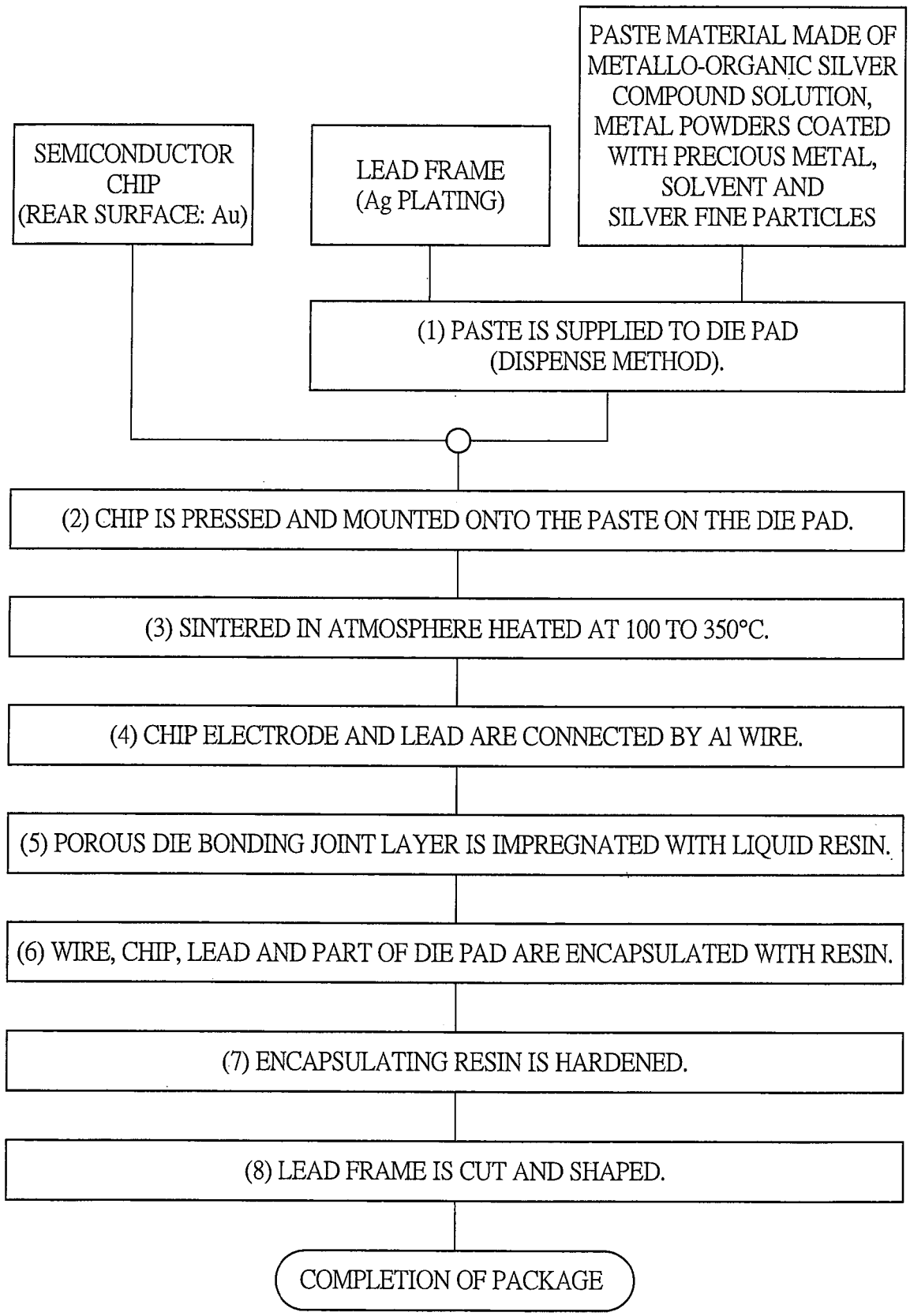
FIG. 13 is an explanatory diagram showing an example of the manufacturing flow of a semiconductor apparatus according to an embodiment of the present invention.

FIG. 13 shows an example of a manufacturing process of a semiconductor apparatus according to the tenth embodiment. In FIG. 13, a chip provided with a rear-surface electrode whose outermost surface is Au and a lead frame having a die bonding portion plated with Ag are prepared as the components to be assembled. Also, the dispenser in which the paste made of the metallo-organic silver compound solution, the metal powders coated with precious metal, the silver particles and the solvent is loaded as the joint material for the die bonding is prepared.

First, the joint material is supplied from the dispenser onto the die pad of the lead frame, and the chip is mounted thereon by pressing the same from above while lightly scrubbing the chip. After the chips are mounted on all of the die pads on the multiple lead frames, they are conveyed in the programmable baking chamber in the atmosphere and then heated in the two-stage processes of about 100° C. and about 250° C. More specifically, the die bonding process is performed along the heating curve that the temperature inside the chamber is increased to about 100° C. in 30 minutes, maintained at about 100° C. for about 30 minutes, and then maintained at about 250° C. for about 30 minutes. Thereafter, the main-surface electrode made of Al of the main surface (circuit surface) of the chip and the lead plated with Ni are bonded by Al wires. Subsequently, the porous die bonding portion is impregnated with a small amount of liquid resin. Then, the resin molding using the molding die is performed and the resin is subjected to the hardening bake treatment. Further, after shaping the lead frame, unnecessary portions are cut and removed, thereby fabricating the semiconductor apparatus.

According to the present embodiment, since the semiconductor apparatus with the reflow resistance of about 260° C. can be manufactured with a lead-free joint material by the use of the process and assembling equipment used for the high-Pb-content solder, the completely lead-free semiconductor apparatus can be manufactured at a low manufacturing cost.

In the foregoing, the invention made by the inventors of the present invention has been concretely described based on the embodiments. However, it is needless to say that the present invention is not limited to the foregoing embodiments and various modifications and alterations can be made within the scope of the present invention.

The semiconductor apparatus, the manufacturing method of a semiconductor apparatus and the joint material according to the present invention can be widely applied to a semiconductor apparatus manufactured through the process in which a chip or a semiconductor package is mounted by the use of a lead-free joint material, a manufacturing process of the semiconductor device and the joint material.

What is claimed is:

1. A semiconductor apparatus having a structure in which one or more semiconductor parts and one or more conductive members are connected through electric conduction,
    wherein a bonding layer containing silver is formed at a joint portion between the semiconductor part and the conductive member,
    holes are formed in the bonding layer so as to be almost evenly dispersed in a whole area of the bonding layer,
    a volume ratio occupied by the holes in the bonding layer is in a range from 5 vol % to 70 vol %, and
    a joint structure is formed in which the semiconductor part and the bonding layer, and the joint portion and the conductive member are metallically bonded respectively using silver as a bonding material,
    wherein silver is the main component of the metallic bond.

2. The semiconductor apparatus according to claim 1,
    wherein the semiconductor part includes a power transistor element, and
    the volume ratio occupied by the holes in the bonding layer is in a range from 20 vol % to 70 vol %.

3. The semiconductor apparatus according to claim 2, wherein a part of the conductive member and the semiconductor part are encapsulated with resin, the semiconductor part is provided with a first electrode and a second electrode on a first main surface and a second main surface reverse to the first main surface, respectively, a first conductive member of the conductive members is metallically bonded to the first electrode via the bonding layer, a second conductive member of the conductive members is metallically bonded to the second electrode via the bonding layer, the first conductive member and the second conductive member extend to outside of the resin, and the volume ratio occupied by the holes in the bonding layer is in a range from 50 vol % to 70 vol %.

4. The semiconductor apparatus according to claim 1, wherein the semiconductor part includes elements for a high-frequency device, a plurality of first electrodes are formed on a first main surface of the semiconductor part, the semiconductor part is electrically connected to the conductive member via the plurality of first electrodes, the plurality of first electrodes are metallically bonded to the conductive member via the bonding layer, and the volume ratio occupied by the holes in the bonding layer is in a range from 5 vol % to 10 vol %.

5. The semiconductor apparatus according to claim 1, wherein insulating resin is filled at least in a part of the holes.

6. The semiconductor device according to claim 1, wherein the bonding layer is formed of one or more high-melting-point and well-conductive metal powders and a silver bonding material for coupling the metal powders.

7. The semiconductor device according to claim 6, wherein a maximum particle diameter of the metal powders is 15 μm to 200 μm.

8. The semiconductor device according to claim 6, wherein the metal powders are formed of either one of single metal powders of gold, silver, copper and nickel and composite metal powders obtained by coating an outermost surface of copper, nickel, aluminum, magnesium, molybdenum or tungsten serving as a core material with gold or silver.

9. A semiconductor apparatus having a structure in which one or more semiconductor parts and one or more conductive members are connected through electric conduction, wherein a bonding layer is formed at a joint portion between the semiconductor part and the conductive member, the bonding layer is formed of high-melting-point and well-conductive metal powders and a silver bonding material for coupling them, and a joint structure is formed in which the semiconductor part and the bonding layer, and the joint portion and the conductive member are metallically bonded respectively with the silver bonding material, wherein silver is the main component of the silver bonding material, wherein a volume ratio occupied by holes in the bonding layer is in a range from 5 vol % to 70 vol %.

10. The semiconductor apparatus according to claim 9, wherein a maximum particle diameter of the metal powders is 15 μm to 200 μm.

11. The semiconductor apparatus according to claim 9, wherein the metal powders are formed of either one of single metal powders of gold, silver, copper and nickel and composite metal powders obtained by coating an outermost surface of copper, nickel, aluminum, magnesium, molybdenum or tungsten serving as a core material with gold or silver.

* * * * *